United States Patent
Chen

(10) Patent No.: US 10,181,289 B1
(45) Date of Patent: Jan. 15, 2019

(54) AMOLED PIXEL DRIVING CIRCUIT AND PIXEL DRIVING METHOD

(71) Applicant: Shenzhen China Star Optoelectronics Semiconductor Display Technology Co., Ltd., Shenzhen (CN)

(72) Inventor: Xiaolong Chen, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/572,794

(22) PCT Filed: Aug. 29, 2017

(86) PCT No.: PCT/CN2017/099381
§ 371 (c)(1),
(2) Date: Nov. 9, 2017

(51) Int. Cl.
*G09G 3/3233* (2016.01)
*G09G 3/3258* (2016.01)
*H01L 27/32* (2006.01)
*H01L 51/52* (2006.01)

(52) U.S. Cl.
CPC ....... *G09G 3/3258* (2013.01); *H01L 27/3244* (2013.01); *H01L 51/5206* (2013.01); *H01L 51/5221* (2013.01); *G09G 2310/0264* (2013.01)

(58) Field of Classification Search
CPC .. G09G 3/3233; G09G 3/3258; G09G 3/3225; G09G 3/3208; G09G 3/3283; G09G 2300/0819; G09G 2310/0264; G09G 2310/08; G09G 2320/045; G09G 2320/0233; G09G 2300/0852; G09G 2320/043; G09G 2300/043; G09G 2300/0842; G09G 2300/0809; G09G 2300/0439; H01L 27/3244; H01L 51/5206; H01L 51/5221
See application file for complete search history.

(56) References Cited

U.S. PATENT DOCUMENTS

| | | | |
|---|---|---|---|
| 2010/0220038 A1* | 9/2010 | Chung | G09G 3/3233 345/76 |
| 2013/0043796 A1* | 2/2013 | Ko | G09G 3/3233 315/151 |
| 2015/0302798 A1* | 10/2015 | Tan | G09G 3/3233 345/698 |
| 2016/0055797 A1* | 2/2016 | Tan | G09G 3/3258 345/206 |

* cited by examiner

*Primary Examiner* — Hong Zhou

(57) ABSTRACT

The present disclosure provides an AMOLED pixel driving circuit and pixel driving method, where the pixel driving circuit includes one side of a first capacitor coupled to the other side of a second capacitor, a gate of a fifth thin film transistor receives a first scanning signal, a drain of the fifth thin film transistor couples to a cathode of an OLED and a source of a third thin film transistor, a gate of the third thin film transistor receives a second scanning signal.

15 Claims, 6 Drawing Sheets

AMOLED PIXEL DRIVING CIRCUIT AND PIXEL DRIVING METHOD

RELATED APPLICATIONS

This application is a National Phase of PCT Patent Application No. PCT/CN2017/099381 having International filing date of Aug. 29, 2017, which claims the benefit of priority of Chinese Patent Application No. 201710560854.9 filed on Jul. 11, 2017. The contents of the above applications are all incorporated by reference as if fully set forth herein in their entirety.

FIELD AND BACKGROUND OF THE INVENTION

The present disclosure relates to the field of display technology, and more particularly to an active matrix organic light-emitting diode (AMOLED) pixel driving circuit and a pixel driving method.

Organic light emitting display (OLED) devices have become the display devices having the highest developmental potential due their advantages, such as self-illumination, low driving voltage, high illumination efficiency, short response period, high definition and high contrast, nearly 180 degree viewing angle, wide operating temperatures, flexible display, a large full-color display area, etc.

Conventional AMOLED pixel driving circuits are always 2T1C, which means being composed of two thin film transistors and one capacitor.

Please refer to FIG. 1, the present AMOLED pixel driving circuit with a 2T1C structure comprises a first thin film transistor T10, a second thin film transistor T20, a capacitor C10, and an OLED D10. The first thin film transistor T10 is a driving thin film transistor, the second thin film transistor T20 is a switching thin film transistor, and the capacitor C10 is a storage capacitor. More specifically, a gate of the second thin film transistor T 20 receives a scanning signal Gate, a source of the second thin film transistor T 20 receives a data signal Data, and a drain of the second thin film transistor T 20 couples to a gate of the first thin film transistor T10. A source of the first thin film transistor T10 receives a positive voltage OVDD of a power source, a drain of the first thin film transistor T 10 couples to an anode of the OLED D10. The cathode of the OLED D10 receives a negative voltage OVSS of a power source. One side of the capacitor C10 couples to a gate of the first thin film transistor T10, the other side of the capacitor C10 couples to a source of the first thin film transistor T10. While the 2T1C pixel driving circuit drives the AMOLED, the current flowing through the OLED D10 meets the following condition:

$$I = k \times (Vgs - Vth)2,$$

where I represents a current flowing through the OLED D10, k represents an intrinsic conductive factor of the driving thin film transistor, Vgs represents the voltage difference between a gate and a source of the first thin film transistor T10, and Vth represents the threshold voltage of the first thin film transistor T10. Therefore, it can be seen that the current flowing through the OLED D10 relates to the threshold voltage for driving thin film transistors.

The threshold voltages for the driving the thin film transistors in each of the pixel driving circuits vary due to instability resulting from the manufacturing processes of panels. Therefore, the currents flowing into OLEDs will be different, even when the same data voltage on the driving thin film transistors is applied to each of the pixel driving circuits. As a result, consistency and image display quality will be affected. Once the driving duration becomes longer, materials of thin film transistor begin deteriorating and varying, then the threshold voltage for driving the thin film transistor will drift. Also, drifting variations of the threshold voltages of each of the driving thin film transistors are different due to deteriorating diversity of the materials. Those foregoing occasions leads to issues such as unevenness in the display, increase in starting voltage for driving the thin film transistors, decrease of the current flowing through the OLED, decline in luminosity, and decline of illuminating efficiency.

Therefore, an AMOLED pixel driving circuit and method is required to solve the problems of the present technology.

SUMMARY OF THE INVENTION

The object of this disclosure provides an AMOLED pixel driving circuit and pixel driving method which can enhance the consistency of the display, the illumination of the panels, and the efficiency of illumination.

To solve the above-mentioned technical problems, the present disclosure provides an AMOLED pixel driving circuit which comprises:

a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein an anode of the OLED receives a positive voltage of a power source; one side of the second capacitor receives the positive voltage of the power source, the other side of the second capacitor is coupled to one side of the first capacitor;

a gate of the fifth thin film transistor receives a first scanning signal, a source of the fifth thin film transistor receives the positive voltage of the power source, a drain of the fifth thin film transistor is coupled to a cathode of the OLED and a source of the third thin film transistor;

a gate of the third thin film transistor receives a second scanning signal, a drain of the third thin film transistor is coupled to the a drain of the first thin film transistor and a drain of the second thin film transistor;

a gate of the second thin film transistor receives the first scanning signal, a source of the second thin film transistor is coupled to a node between the second capacitor and the first capacitor;

a gate of the first thin film transistor is coupled to the node between the second capacitor and the first capacitor, a source of the first thin film transistor is coupled to the other side of the first capacitor, a drain of the fourth thin film transistor, and a drain of the sixth thin film transistor;

a gate of the sixth thin film transistor receives the second scanning signal, a source of the sixth thin film transistor receives a negative voltage of the power source;

a gate of the fourth thin film transistor receives a third scanning signal, a source of the fourth thin film transistor receives a data voltage;

the first scanning signal, the second scanning signal, and the third scanning signal are generated from an external timing controller; the first thin film transistor, the second thin film transistor, the third thin film transistor, the fourth thin film transistor, the fifth thin film transistor, and the sixth thin film transistor are N-type thin film transistors.

In the AMOLED pixel driving circuit of the present disclosure, the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

In the AMOLED pixel driving circuit of the present disclosure, the first scanning signal, the second scanning signal, and the third scanning signal correspond to a initializing stage, a threshold voltage storing stage, and a light illuminating stage respectively;

in the initializing stage, the first scanning signal and the second scanning signal are at a high potential, the third scanning signal is at a low potential;

in the threshold voltage storing stage, the first scanning signal and the third scanning signal are at a high potential, the second scanning signal is at a low potential;

in the light illuminating stage, the first scanning signal and the third scanning signal are at a low potential, the second scanning signal is at a high potential.

To solve the above-mentioned technical problems, the present disclosure provides an AMOLED pixel driving circuit which comprises:

a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein an anode of the OLED receives a positive voltage of a power source; one side of the second capacitor receives the positive voltage of the power source, the other side of the second capacitor is coupled to one side of the first capacitor;

a gate of the fifth thin film transistor receives a first scanning signal, a source of the fifth thin film transistor receives the positive voltage of the power source, a drain of the fifth thin film transistor is coupled to a cathode of the OLED and a source of the third thin film transistor;

a gate of the third thin film transistor receives a second scanning signal, a drain of the third thin film transistor is coupled to the a drain of the first thin film transistor and a drain of the second thin film transistor;

a gate of the second thin film transistor receives the first scanning signal, a source of the second thin film transistor is coupled to a node between the second capacitor and the first capacitor;

a gate of the first thin film transistor is coupled to the node between the second capacitor and the first capacitor, a source of the first thin film transistor is coupled to the other side of the first capacitor, a drain of the fourth thin film transistor, and a drain of the sixth thin film transistor;

a gate of the sixth thin film transistor receives the second scanning signal, a source of the sixth thin film transistor receives a negative voltage of the power source;

a gate of the fourth thin film transistor receives a third scanning signal, a source of the fourth thin film transistor receives a data voltage.

In the AMOLED pixel driving circuit of the present disclosure, the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

In the AMOLED pixel driving circuit of the present disclosure, the first scanning signal, the second scanning signal, and the third scanning signal are generated from an external timing controller.

In the AMOLED pixel driving circuit of the present disclosure, the first thin film transistor, the second thin film transistor, the third thin film transistor, the fourth thin film transistor, the fifth thin film transistor, and the sixth thin film transistor are N-type thin film transistors.

In the AMOLED pixel driving circuit of the present disclosure, the first scanning signal, the second scanning signal, and the third scanning signal correspond to a initializing stage, a threshold voltage storing stage, and a light illuminating stage respectively;

in the initializing stage, the first scanning signal and the second scanning signal are at a high potential, the third scanning signal is at a low potential; in the threshold voltage storing stage, the first scanning signal and the third scanning signal are at a high potential, the second scanning signal is at a low potential;

in the light illuminating stage, the first scanning signal and the third scanning signal are at a low potential, the second scanning signal is at a high potential.

In the AMOLED pixel driving circuit of the present disclosure, the first thin film transistor is a driving thin film transistor, the fifth thin film transistor is a switch thin film transistor.

The present disclosure further provides an AMOLED pixel driving method which comprises:
    providing an AMOLED pixel driving circuit;
    entering an initializing stage;
    entering a threshold voltage storing stage; and
    entering a light illuminating stage;
    wherein the AMOLED pixel driving circuit comprises:
    a first thin film transistor, a second thin film transistor, a third thin film transistor, a fourth thin film transistor, a fifth thin film transistor, a sixth thin film transistor, a first capacitor, a second capacitor, and an organic light-emitting diode (OLED);

an anode of the OLED receives a positive voltage of a power source; one side of the second capacitor receives the positive voltage of the power source, the other side of the second capacitor is coupled to one side of the first capacitor;

a gate of the fifth thin film transistor receives a first scanning signal, a source of the fifth thin film transistor receives the positive voltage of the power source, a drain of the fifth thin film transistor is coupled to a cathode of the OLED and a source of the third thin film transistor;

a gate of the third thin film transistor receives a second scanning signal, a drain of the third thin film transistor is coupled to the a drain of the first thin film transistor and a drain of the second thin film transistor;

a gate of the second thin film transistor receives the first scanning signal, a source of the second thin film transistor is coupled to a node between the second capacitor and the first capacitor;

a gate of the first thin film transistor is coupled to the node between the second capacitor and the first capacitor, a source of the first thin film transistor is coupled to the other side of the first capacitor, a drain of the fourth thin film transistor, and a drain of the sixth thin film transistor;

a gate of the sixth thin film transistor receives the second scanning signal, a source of the sixth thin film transistor receives a negative voltage of the power source;

a gate of the fourth thin film transistor receives a third scanning signal, a source of the fourth thin film transistor receives a data voltage;

in the initializing stage, the first scanning signal provides
        a high potential, the second thin film transistor and the
        fifth thin film transistor are on; the second scanning
        signal provides a high potential, the third thin film
        transistor and the sixth thin film transistor are on; the
        third scanning signal provides a low potential, the
        fourth thin film transistor is off; a voltage of the gate of the first thin film transistor is equal to the positive voltage of the power source, a voltage of the source of the first thin film transistor is equal to the negative voltage of the power source;

in the threshold voltage storing stage, the first scanning signal provides a high potential, the second thin film transistor and the fifth thin film transistor are on; the second scanning signal provides a low potential, the third thin film transistor and the sixth thin film transistor are off; the third scanning signal provides a high potential, the fourth thin film transistor is on; a voltage of the source of the first thin film transistor is equal to the data voltage, a voltage of the gate of the first thin film transistor changes into Vd+Vth, wherein the Vd is the data voltage, Vth is a threshold voltage of the first thin film transistor;

in the light illuminating stage, the first scanning signal provides a low potential, the second thin film transistor and the fifth thin film transistor are off; the second scanning signal provides a high potential, the third thin film transistor and the sixth thin film transistor are on; the third scanning signal provides a low potential, the fourth thin film transistor is off; the OLED illuminates, wherein an electric current which flows through the OLED is irrelevant to the threshold voltage of the first thin film transistor.

In the AMOLED pixel driving method of the present disclosure, in the light illuminating stage, a voltage applied to the source of the first thin film transistor changes into the negative voltage of the power source, and a voltage applied to the gate of the first thin film transistor changes into Vd+Vth+δ V so that electric current flowing through the OLED is irrelevant to the threshold voltage of the first thin film transistor, wherein δ V is a variation of the voltage applied to the gate of the first thin film transistor as the voltage applied to the source of the first thin film transistor changing from the data voltage to the negative voltage of the power source.

In the AMOLED pixel driving method of the present disclosure, the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistor.

In the AMOLED pixel driving method of the present disclosure, the first scanning signal, the second scanning signal, and the third scanning signal are generated from an external timing In the AMOLED pixel driving method of the present disclosure, the first thin film transistor is a driving thin film transistor, the fifth thin film transistor is a switch thin film transistor.

In the AMOLED pixel driving method of the present disclosure, the first thin film transistor, the second thin film transistor, the third thin film transistor, the fourth thin film transistor, the fifth thin film transistor, and the sixth thin film transistor are N-type thin film transistors.

By improving the present pixel driving circuit, the AMOLED pixel driving circuit and the pixel driving method of the present disclosure eliminates the affection to the OLED caused by the threshold voltage of driving thin film transistor. Also, the unevenness of the display is improved. In addition, the problems of the panels accompanying the deterioration of OLED components, such as the decline of the illumination and illuminating efficiency, can be avoided.

DETAILED DESCRIPTION OF THE PREFERRED SPECIFIC EMBODIMENTS OF THE INVENTION

The illustrations of the following embodiments take the attached drawings as reference to indicate the applicable specific examples of the present disclosure. The mentioned directional terms, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto. Units having similar structures are numbered the same.

Figure 1:
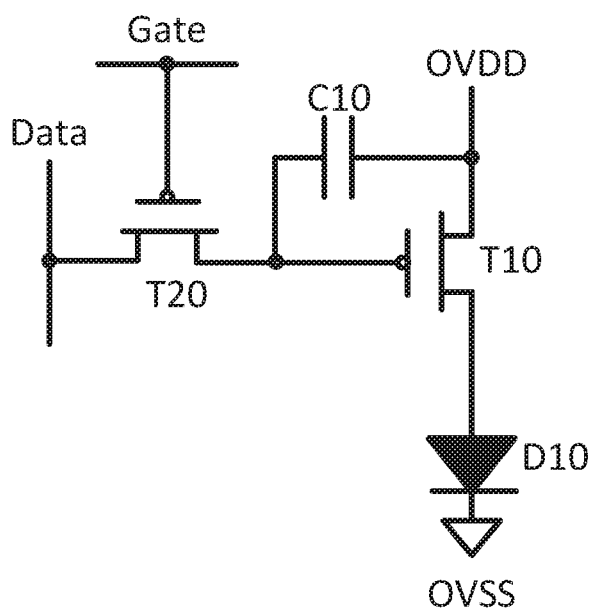
FIG. 1 illustrates a circuit diagram of the present 2T1C pixel driving circuit applied to an AMOLED.
Figure 2:
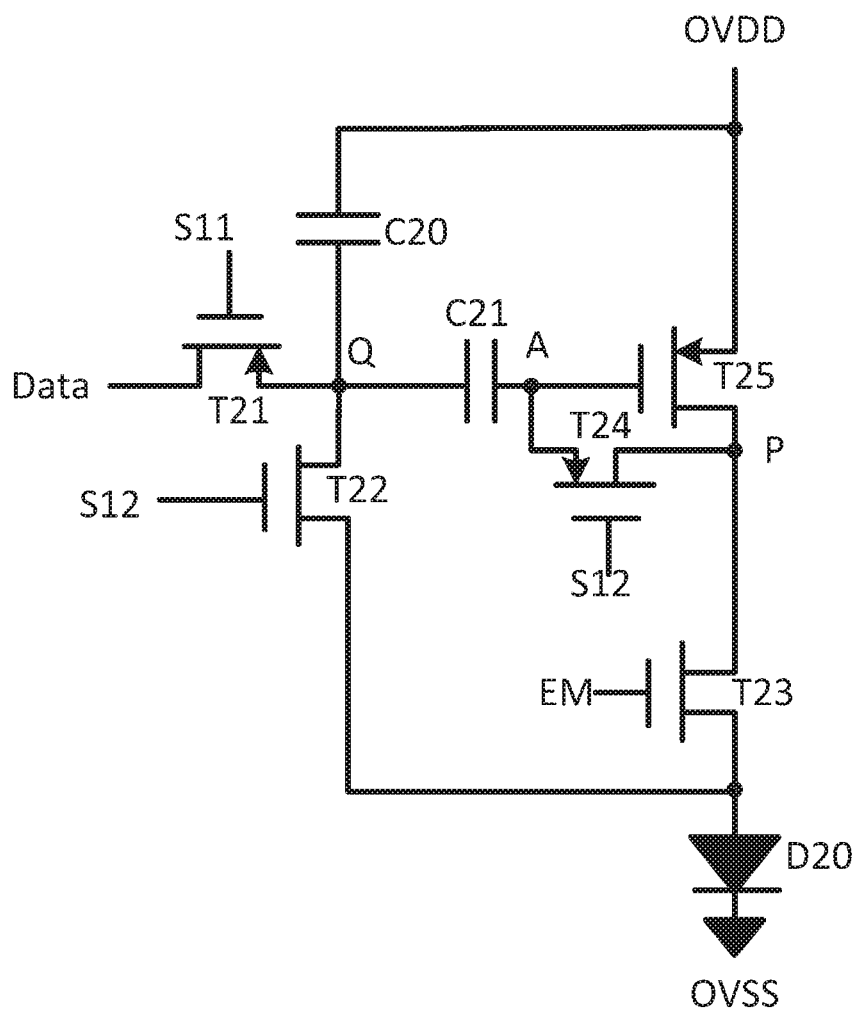
FIG. 2 illustrates a circuit diagram of the present 5T2C pixel driving circuit applied to an AMOLED.

The general solutions, which aim to drifting threshold voltage for driving the thin film transistor (TFT), are improving the AMOLE pixel driving circuit by increasing the number of the thin film transistors and the number of control signals, in order to compensate the threshold voltages for driving the thin film transistors. Therefore, the currents flowing through the OLED can be irrelevant to the threshold voltage for driving the thin film transistors when the OLED illuminates. Please refer to FIG. 2 which illustrates an AMOLED pixel driving circuit adopting the 5T2C structure, i.e., the structure is composed of five thin film transistors and two capacitors. The 5T2C structure comprises a first thin film transistor T21, a second thin film transistor T22, a third thin film transistor T23, a fourth thin film transistor T24, a fifth thin film transistor T25, a first capacitor C20, a second capacitor C21, and an OLED D20. The particular connections are: a gate of the first thin film transistor T21 receives a scanning signal Sit a source of the first thin film transistor T21 receives a data signal Data, a drain of the first thin film transistor T21 couples to a first node Q, a gate of the second thin film transistor T22 receives a scanning signal S12, a source of the second thin film transistor T22 couples to the first node Q, and a drain of the second thin film transistor T22 couples to the anode of the OLED D20.

One side of the first capacitor C20 connects to the first node Q, the other side of the first capacitor C20 receives a positive voltage OVDD of a power source, one side of the second capacitor C21 connects to the first node Q, the other side of the second capacitor C21 couples to a gate of the fifth thin film transistor T25 and a source of the fourth thin film transistor T24, a drain of the fourth thin film transistor T24 couples to the second node P, a gate of the fourth thin film transistor T24 receives the second scanning signal S12, a source of the fifth thin film transistor T25 receives a positive voltage OVDD of a power source, a drain of the fifth thin film transistor T25 couples to a second node P, a gate of the third thin film transistor T23 receive a emitting signal EM, a source of the third thin film transistor T23 couples to the second node P, a drain of the third thin film transistor T23 couples to the anode of the OLED D20, and the cathode of the OLED D20 couples to a negative voltage OVSS of a power source.

Although the above-mentioned 5T2C structure can eliminate the Vth for driving the thin film transistor; however, the potential of node A still remains in Vdata+OVDD-Vth-Vref in the Data Writing stage and the Emission stage, where Vref is a reference voltage. The luminosity of OLEDs in every pixel are various due to the unevenness of the OLEDs in the panel. Therefore, if Vref becomes too high, OLEDs will illuminate during resetting stage. If Vref becomes too low, the potential of node A in the Data Writing stage and the Emission stage becomes too high, and the driving thin film transistors will be lead to cut-off status so that the value of Vref becomes unstable.

Figure 3:
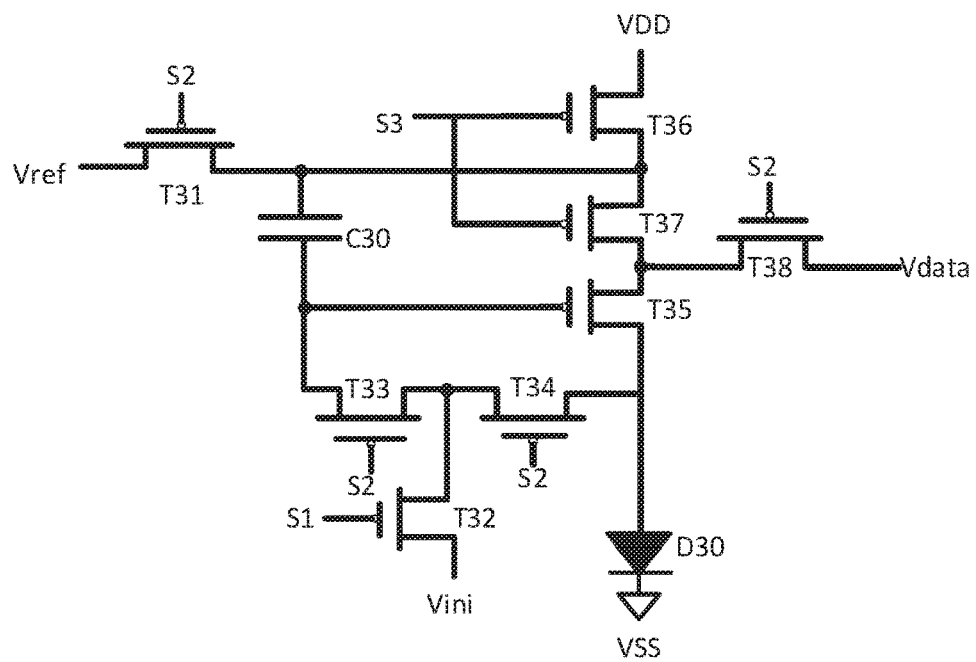
FIG. 3 illustrates a circuit diagram of the present 8T1C pixel driving circuit applied to AMOLED.

FIG. 3 illustrates another type of AMOLED pixel driving circuit adopting an 8T1C structure, i.e., a structure composed by 8 thin film transistors and one capacitor. The 8T1C structure comprises a first thin film transistor T31, a second thin film transistor T32, a third thin film transistor T33, a fourth thin film transistor T34, a fifth thin film transistor T35, a sixth thin film transistor T36, a seventh thin film transistor T37, an eighth thin film transistor T38, a capacitor C30, and an OLED D30. The particular connections are: a gate of the first thin film transistor T31 receives a scanning signal S2, a source of the first thin film transistor T31 receives a reference voltage Vref, a drain of the first thin film transistor T31 couples to one side of the capacitor C30 and a source of the seventh thin film transistor T37, the other side of the capacitor C30 couples to a source of the third thin film transistor T33 and a gate of the fifth thin film transistor T35, a drain of the third thin film transistor T33 couples to a source of the fourth thin film transistor T34 and a drain of the second thin film transistor T32, a gate of the second thin film transistor T32 receives the scanning signal S1, a source of the second thin film transistor T32 receives a voltage Vini. A gate of the third thin film transistor T33 and a gate of the fourth thin film transistor T34 receive the scanning signal S2.

A drain of the fourth thin film transistor T34 couples to a drain of the fifth thin film transistor T35 and the anode of the OLED D30, the cathode of the OLED D30 receives a negative voltage VSS of a power source, a source of the fifth thin film transistor T35 couples to a drain of the eighth thin film transistor T38 and a drain of the seventh thin film transistor T37, a source of the seventh thin film transistor T37 couples to a drain of the sixth thin film transistor, a source of the sixth thin film transistor T36 receives a positive voltage VDD of a power source, both a gate of the sixth thin film transistor T36 and a gate of the seventh thin film transistor T37 receive the scanning signal S3, a gate of the eighth thin film transistor T38 receives the scanning signal S2, and a source of the eighth thin film transistor T38 receives the date voltage Vdata.

The above-mentioned 8T1C structure can eliminate the Vth for driving TFTs; however, more TFTs are required. Thus, the aperture ratio of the panels is decreased, which leads to the decline of the displaying illumination. In addition, more TFTs will produce parasitic capacitors. On the other hand, the number of inputted signals will increase because this structure requires two external powers Vref and Vini, Please refer to FIG. 4 which illustrates the circuit diagram of the AMOLED pixel driving circuit of the present disclosure.

Figure 4:
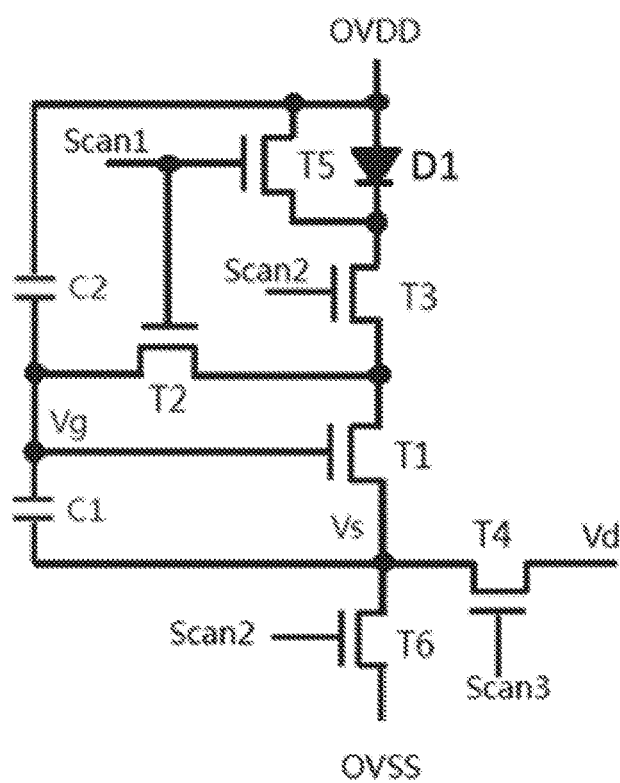
FIG. 4 illustrates a circuit diagram of an AMOLED pixel driving circuit of the present disclosure.

As shown in FIG. 4, the AMOLED pixel driving circuit of the present disclosure comprises a first thin film transistor T1, a second thin film transistor T2, a third thin film transistor T3, a fourth thin film transistor T4, a fifth thin film transistor T5, a sixth thin film transistor T6, a first capacitor C1, a second capacitor C2, and an OLED D1, where the first thin film transistor T1 is a driving thin film transistor and the fifth thin film transistor T5 is a switching thin film transistor.

The particular connections of each component are as follows: the anode of the OLED D1 receives the positive voltage OVDD of a power source; one side of the second capacitor C2 receives the positive voltage OVDD of a power source; the other side of the second capacitor C2 couples to one side of the first capacitor C1.

A gate of the fifth thin film transistor receives the first scanning signal Scan1, a source of the fifth thin film transistor T5 receives a positive voltage OVDD of a power source, and a drain of the fifth thin film transistor T5 couples to the cathode of the OLED D1.

A gate of the third thin film transistor T3 receives the second scanning signal Scan2, a source of the third thin film transistor T3 couples to the cathode of the OLED D1, i.e., a source of the third thin film transistor T3 couples to the cathode of the OLED D1 and a drain of the fifth thin film transistor T5. A drain of the third thin film transistor T3 couples to a drain of the first thin film transistor T1 and a drain of the second thin film transistor T2.

A gate of the second thin film transistor T2 receives the first scanning signal Scan1, a source of the second thin film transistor T2 couples to a node between the second capacitor C2 and the first capacitor C1.

A gate of the first thin film transistor T1 couples to a node between the second capacitor C2 and the first capacitor C1, a source of the first thin film transistor T1 couples to the other side of the first capacitor C1.

A gate of the sixth thin film transistor T6 receives a second scanning Scan2, a source of the sixth thin film transistor T6 receives the negative voltage OVSS of a power source, a drain of the sixth thin film transistor T6 couples to a source of the first thin film transistor T1, i.e., a drain of the sixth thin film transistor T6 couples to a source of the first thin film transistor T1, the other side of the first capacitor C1 and a drain of the fourth thin film transistor T4.

A gate of the fourth thin film transistor T4 receives the third scanning signal Scan3, a source of the fourth thin film transistor T4 receives the data voltage Vd, a drain of the fourth thin film transistor T4 couples to a gate of the first thin film transistor T1, i.e., a drain of the fourth thin film transistor T4 couples to a source of the first thin film transistor T1, a drain of the sixth thin film transistor T6, and the other side of the first capacitor C1.

The first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

The first scanning signal, the second scanning signal, and the third scanning signal are generated from an external timing controller.

The first thin film transistor, the second thin film transistor, the third thin film transistor, the fourth thin film transistor, the fifth thin film transistor, and the sixth thin film transistor are N-type thin film transistors.

The first scanning signal, the second scanning signal, and the third scanning signal correspond to an initializing stage, a threshold voltage storing stage, and a light illuminating stage respectively.

On the basic of above-mentioned AMOLED pixel driving circuit, the present disclosure further provides an AMOLED pixel driving method comprising the following steps:

Step S101, providing an AMOLED pixel driving circuit.

Please refer to FIG. 4 and the context above for the specific content.

Step S102, entering the initialization stage.

Figure 5:
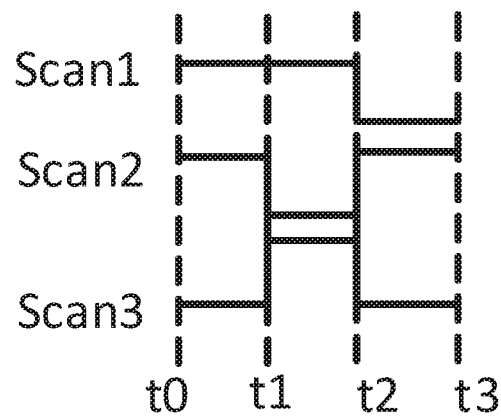
FIG. 5 illustrates a timing diagram of an AMOLED pixel driving circuit of the present disclosure.
Figure 6:
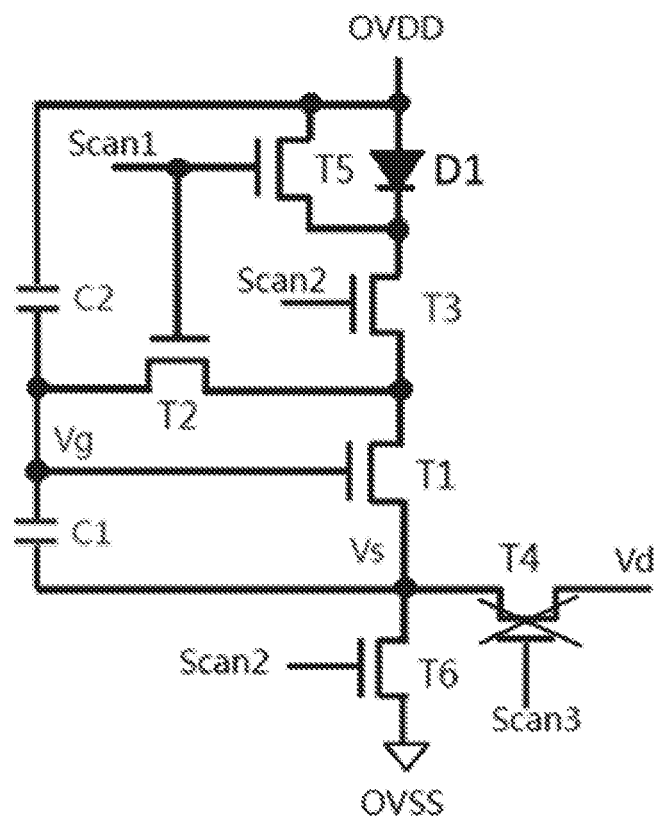
FIG. 6 illustrates step 2 of an AMOLED pixel driving method of the present disclosure.

As shown in FIG. 5, together with FIG. 6, in the initialization stage, i.e., during the period t0-t1, the first scanning signal Scan1 and the second scanning signal Scan2 are at a high potential, the third scanning signal Scan3 is at a low potential.

The first scanning signal Scan1 provides a high potential to make the second thin film transistor T2 and the fifth thin film transistor T5 be on. The second scanning Scan2 provides a high potential to make the third thin film transistor T3 and the sixth thin film transistor T6 to be on. The third scanning signal Scan3 provides a low potential and the fourth thin film transistor T4 is off. A gate of the first thin film transistor T1 (simplified named as node g) is charged by the positive voltage OVDD of a power source, so that the voltage of the first thin film transistor Vg equals to the positive voltage OVDD. Because the sixth thin film transistor T6 is on, the negative voltage OVSS of a power source charges to a source of the first thin film transistor T1 (simplified named as node s) to make the voltage of the first thin film transistor T1 equals to the negative voltage OVSS of a power source. Because the fifth thin film transistor T5 is on, the OLED D1 does not illuminate. The initialization of node g and node s is completed in this stage.

Step S103, entering the threshold voltage storing stage.

Figure 7:
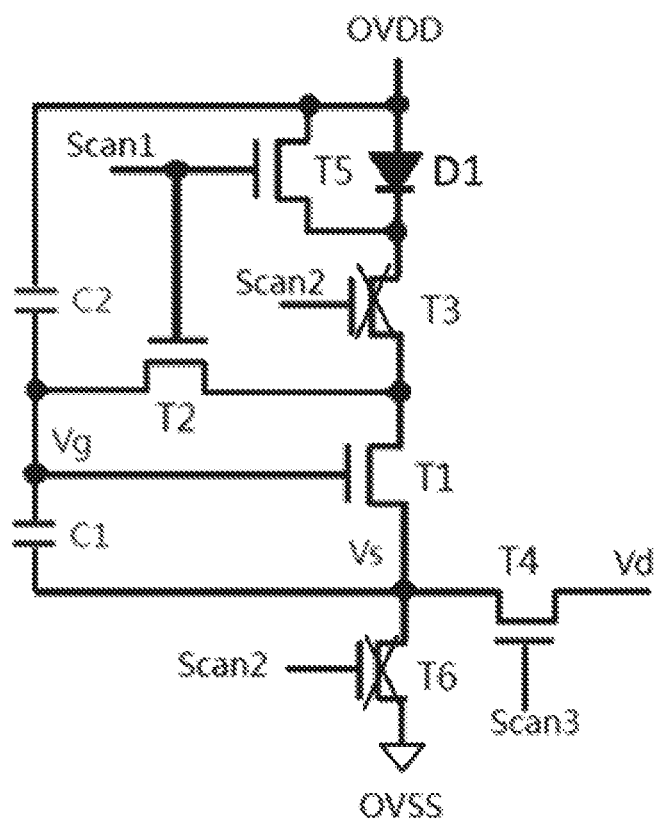
FIG. 7 illustrates step 3 of the AMOLED pixel driving method of the present disclosure.

As shown in FIG. 5, together with FIG. 7, in the threshold voltage storing stage, i.e. during the period t1-t2, the first scanning signal Scan1 and the third scanning signal Scan3 are at a high potential, the second scanning signal Scan2 is at a low potential.

The first scanning signal Scan1 provides a high potential to make the second thin film transistor T2 and the fifth thin film transistor T5 to be on. The second scanning signal Scan2 provides a low potential to make the third thin film transistor T3 and the sixth thin film transistor T6 to be off. The third scanning signal Scan3 provides a high potential and the fourth thin film transistor T4 is on, so that the data voltage Vd charges to node s. The gate voltage of the first thin film transistor T1 (Vs) equals to the data voltage Vd. Because the second thin film transistor T2 is on and the third thin film transistor T3 is off, the potential of node g keeps discharging through the first thin film transistor T1 and the second thin film transistor T2 until the differential voltage between the node g and node s reaches the threshold voltage for driving the thin film transistor T1, i.e., Vth.

Vg and Vs satisfy the following formula:

$$Vg-Vs=Vth,$$

where Vs=Vd,

Therefore, Vg=Vd+Vth.

That is, the voltage of a gate of the first thin film transistor T1 changes into Vd+Vth, where Vg represents the voltage of the node g, Vs represents the voltage of the node s, Vd represents the data voltage, Vth represents the threshold voltage of the first thin film transistor T1.

Because the fifth thin film transistor T5 is on, the OLED D1 does not illuminate. The potential storage of the threshold voltage Vth is completed in this stage.

Step S104, entering the light illuminating stage.

Figure 8:
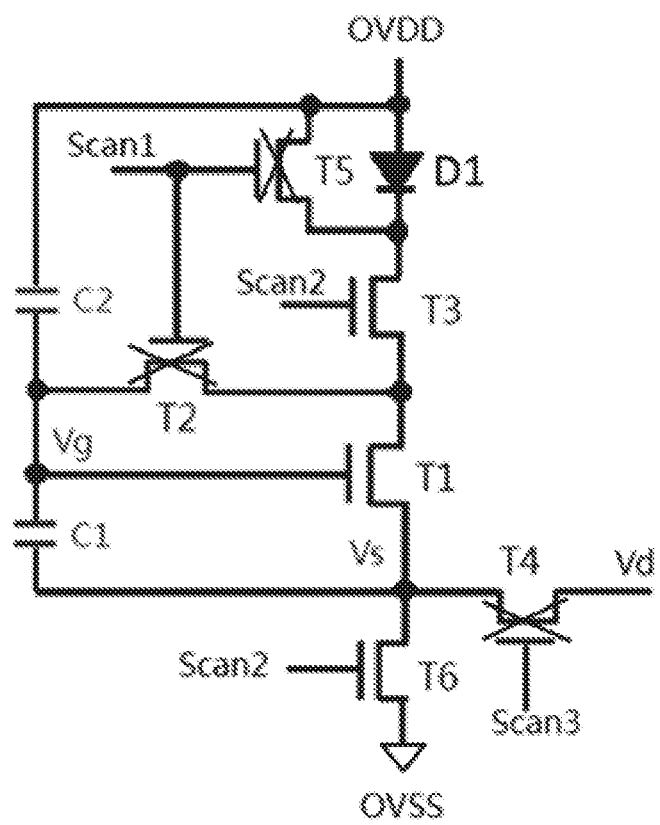
FIG. 8 illustrates step 4 of the AMOLED pixel driving method of the present disclosure.

As shown in FIG. 5, together with FIG. 8, in the light illuminating stage, i.e., the period of t2-t3, the first scanning signal Scan1 and the third scanning signal Scan3 are at a low potential, the second scanning signal Scan2 is at a high potential.

The first scanning signal Scan1 provides a low potential. The second thin film transistor T2 and the fifth thin film transistor T5 are off. The second scanning signal Scan2 provides a high potential. The third thin film transistor T3 and the sixth thin film transistor T6 are on. The third scanning signal Scan3 provides a low potential, and the fourth thin film transistor T4 is off. Because the fifth thin film transistor T5 is off, the OLED D1 illuminate where the current flowing through the OLED D1 is irrelevant to the threshold voltage of the first thin film transistor T1.

More particular, the fourth thin film transistor T4 is off and the sixth thin film transistor T6 is on thus the potential of the node s changes into Vs=OVSS. The second thin film transistor T2 is off.

From the law of capacitive coupling, the potential of the node g (Vg) can be obtained as follows:

$$Vg=Vd+Vth+\delta V,$$

where, $\delta V=(OVSS-Vd)*C1/(C1+C2)$.

Where $\delta V$ represents the variation of the voltage applied to the gate of the first thin film transistor after the voltage applied to the source of the first thin film transistor changing from the data voltage to the negative voltage of the power source. C1 represents the capacitance of the first capacitor and C2 represents the capacitance of the second capacitor.

The differential voltage between the node g and node s changes into the following status at this moment:

$$Vgs=Vg-Vs=\delta V+Vth+Vd-OVSS;$$

The current flowing through the OLED D1 satisfies:

$$I=k(Vgs-Vth)2=k(Vd-OVSS+\delta V)2.$$

To conclude with the above formulas, the final current flowing through the OLED D1 becomes:

$$I=k[(Vd-OVSS)*C2/(C1+C2)]2$$

As a result, the current of the OLED becomes irrelevant to the threshold voltage for driving the first thin film transistor. The affection to the OLED generated from the threshold voltage Vth will be eliminated. Thus, the unevenness and the illuminating efficiency of the displaying are enhanced.

By improving the present pixel driving circuit, the AMOLED pixel driving circuit and pixel driving method of the present disclosure eliminates the affection to the OLED caused from the threshold voltage for driving the thin film transistors. Also, the unevenness of displaying is improved. In addition, the problems of panels accompanying with the deterioration of OLED components, such as the decline of the illumination or the decline of the illuminating efficiency, can be avoided.

In conclusion, although this disclosure has been disclosed through the preferable embodiments above, the preferable embodiments above are not utilized to limit this disclosure. One having ordinary skills can change and modify without violating the concepts and scope of this disclosure. Therefore, the scope that this disclosure protects is based on the scope defined by the claims.

What is claimed is:

1. An active matrix organic light-emitting diode (AMOLED) pixel driving circuit, comprising:
a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein
an anode of the OLED receives a positive voltage of a power source; one side of the second capacitor receives the positive voltage of the power source, the other side of the second capacitor is coupled to one side of the first capacitor;
a gate of the fifth thin film transistor receives a first scanning signal, a source of the fifth thin film transistor receives the positive voltage of the power source, a drain of the fifth thin film transistor is coupled to a cathode of the OLED and a source of the third thin film transistor;
a gate of the third thin film transistor receives a second scanning signal, a drain of the third thin film transistor is coupled to the a drain of the first thin film transistor and a drain of the second thin film transistor;
a gate of the second thin film transistor receives the first scanning signal, a source of the second thin film transistor is coupled to a node between the second capacitor and the first capacitor;
a gate of the first thin film transistor is coupled to the node between the second capacitor and the first capacitor, a source of the first thin film transistor is coupled to the other side of the first capacitor, a drain of the fourth thin film transistor, and a drain of the sixth thin film transistor;
a gate of the sixth thin film transistor receives the second scanning signal, a source of the sixth thin film transistor receives a negative voltage of the power source;
a gate of the fourth thin film transistor receives a third scanning signal, a source of the fourth thin film transistor receives a data voltage;
the first scanning signal, the second scanning signal, and the third scanning signal are generated from an external timing controller; the first thin film transistor, the second thin film transistor, the third thin film transistor, the fourth thin film transistor, the fifth thin film transistor, and the sixth thin film transistor are N-type thin film transistors.

2. The AMOLED pixel driving circuit according to claim 1, wherein the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

3. The AMOLED pixel driving circuit according to claim 1, wherein the first scanning signal, the second scanning signal, and the third scanning signal correspond to a initializing stage, a threshold voltage storing stage, and a light illuminating stage respectively;
in the initializing stage, the first scanning signal and the second scanning signal are at a high potential, the third scanning signal is at a low potential;
in the threshold voltage storing stage, the first scanning signal and the third scanning signal are at a high potential, the second scanning signal is at a low potential;
in the light illuminating stage, the first scanning signal and the third scanning signal are at a low potential, the second scanning signal is at a high potential.

4. An active matrix organic light-emitting diode (AMOLED) pixel driving circuit comprising:
a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein
an anode of the OLED receives a positive voltage of a power source; one side of the second capacitor receives the positive voltage of the power source, the other side of the second capacitor is coupled to one side of the first capacitor;
a gate of the fifth thin film transistor receives a first scanning signal, a source of the fifth thin film transistor receives the positive voltage of the power source, a drain of the fifth thin film transistor is coupled to a cathode of the OLED and a source of the third thin film transistor;
a gate of the third thin film transistor receives a second scanning signal, a drain of the third thin film transistor is coupled to the a drain of the first thin film transistor and a drain of the second thin film transistor;
a gate of the second thin film transistor receives the first scanning signal, a source of the second thin film transistor is coupled to a node between the second capacitor and the first capacitor;
a gate of the first thin film transistor is coupled to the node between the second capacitor and the first capacitor, a source of the first thin film transistor is coupled to the other side of the first capacitor, a drain of the fourth thin film transistor, and a drain of the sixth thin film transistor;
a gate of the sixth thin film transistor receives the second scanning signal, a source of the sixth thin film transistor receives a negative voltage of the power source;
a gate of the fourth thin film transistor receives a third scanning signal, a source of the fourth thin film transistor receives a data voltage.

5. The AMOLED pixel driving circuit according to claim 4, wherein the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

6. The AMOLED pixel driving circuit according to claim 4, wherein the first scanning signal, the second scanning signal, and the third scanning signal are generated from an external timing controller.

7. The AMOLED pixel driving circuit according to claim 4, wherein the first thin film transistor, the second thin film transistor, the third thin film transistor, the fourth thin film transistor, the fifth thin film transistor, and the sixth thin film transistor are N-type thin film transistors.

8. The AMOLED pixel driving circuit according to claim 4, wherein the first scanning signal, the second scanning signal, and the third scanning signal are combined and correspond to a initializing stage, a threshold voltage storing stage, and a light illuminating stage respectively;
in the initializing stage, the first scanning signal and the second scanning signal are at a high potential, the third scanning signal is at a low potential;

in the threshold voltage storing stage, the first scanning signal and the third scanning signal are at a high potential, the second scanning signal is at a low potential;

in the light illuminating stage, the first scanning signal and the third scanning signal are at a low potential, the second scanning signal is at a high potential.

9. The AMOLED pixel driving circuit according to claim 4, wherein the first thin film transistor is a driving thin film transistor, the fifth thin film transistor is a switch thin film transistor.

10. An active matrix organic light-emitting diode (AMOLED) pixel driving method comprising:
providing an AMOLED pixel driving circuit;
entering an initializing stage;
entering a threshold voltage storing stage; and
entering a light illuminating stage;
wherein the AMOLED pixel driving circuit comprises:
a first thin film transistor, a second thin film transistor, a third thin film transistor, a fourth thin film transistor, a fifth thin film transistor, a sixth thin film transistor, a first capacitor, a second capacitor, and an organic light-emitting diode (OLED);
an anode of the OLED receives a positive voltage of a power source; one side of the second capacitor receives the positive voltage of the power source, the other side of the second capacitor is coupled to one side of the first capacitor;
a gate of the fifth thin film transistor receives a first scanning signal, a source of the fifth thin film transistor receives the positive voltage of the power source, a drain of the fifth thin film transistor is coupled to a cathode of the OLED and a source of the third thin film transistor;
a gate of the third thin film transistor receives a second scanning signal, a drain of the third thin film transistor is coupled to the a drain of the first thin film transistor and a drain of the second thin film transistor;
a gate of the second thin film transistor receives the first scanning signal, a source of the second thin film transistor is coupled to a node between the second capacitor and the first capacitor;
a gate of the first thin film transistor is coupled to the node between the second capacitor and the first capacitor, a source of the first thin film transistor is coupled to the other side of the first capacitor, a drain of the fourth thin film transistor, and a drain of the sixth thin film transistor;
a gate of the sixth thin film transistor receives the second scanning signal, a source of the sixth thin film transistor receives a negative voltage of the power source;
a gate of the fourth thin film transistor receives a third scanning signal, a source of the fourth thin film transistor receives a data voltage;
in the initializing stage, the first scanning signal provides a high potential, the second thin film transistor and the fifth thin film transistor are on; the second scanning signal provides a high potential, the third thin film transistor and the sixth thin film transistor are on; the third scanning signal provides a low potential, the fourth thin film transistor is off; a voltage of the gate of the first thin film transistor is equal to the positive voltage of the power source, a voltage of the source of the first thin film transistor is equal to the negative voltage of the power source;

in the threshold voltage storing stage, the first scanning signal provides a high potential, the second thin film transistor and the fifth thin film transistor are on; the second scanning signal provides a low potential, the third thin film transistor and the sixth thin film transistor are off; the third scanning signal provides a high potential, the fourth thin film transistor is on; a voltage of the source of the first thin film transistor is equal to the data voltage, a voltage of the gate of the first thin film transistor changes into Vd+Vth, wherein the Vd is the data voltage, Vth is a threshold voltage of the first thin film transistor;

in the light illuminating stage, the first scanning signal provides a low potential, the second thin film transistor and the fifth thin film transistor are off; the second scanning signal provides a high potential, the third thin film transistor and the sixth thin film transistor are on; the third scanning signal provides a low potential, the fourth thin film transistor is off; the OLED illuminates, wherein an electric current which flows through the OLED is irrelevant to the threshold voltage of the first thin film transistor.

11. The AMOLED pixel driving method according to claim 10, wherein in the light illuminating stage, a voltage applied to the source of the first thin film transistor changes into the negative voltage of the power source, and a voltage applied to the gate of the first thin film transistor changes into Vd+Vth+δ V so that electric current flowing through the OLED is irrelevant to the threshold voltage of the first thin film transistor, wherein δ V is a variation of the voltage applied to the gate of the first thin film transistor as the voltage applied to the source of the first thin film transistor changing from the data voltage to the negative voltage of the power source.

12. The AMOLED pixel driving method according to claim 10, wherein the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

13. The AMOLED pixel driving method according to claim 10, wherein the first scanning signal, the second scanning signal, and the third scanning signal are generated from an external timing controller.

14. The AMOLED pixel driving method according to claim 10, wherein the first thin film transistor is a driving thin film transistor, the fifth thin film transistor is a switch thin film transistor.

15. The AMOLED pixel driving method according to claim 10, wherein the first thin film transistor, the second thin film transistor, the third thin film transistor, the fourth thin film transistor, the fifth thin film transistor, and the sixth thin film transistor are N-type thin film transistors.

* * * * *

UNITED STATES PATENT AND TRADEMARK OFFICE
CERTIFICATE OF CORRECTION

PATENT NO. : 10,181,289 B1  
APPLICATION NO. : 15/572794  
DATED : January 15, 2019  
INVENTOR(S) : Xiaolong Chen Page 1 of 1

It is certified that error appears in the above-identified patent and that said Letters Patent is hereby corrected as shown below:

On the Title Page

Item (30) Foreign Application Priority Data  
Insert the following:  
-- Jul. 11, 2017 (CN)................. 201710560854.9 --

Signed and Sealed this  
Twenty-first Day of May, 2019

Andrei Iancu  
*Director of the United States Patent and Trademark Office*